United States Patent
Liu et al.

(10) Patent No.: US 6,667,227 B1
(45) Date of Patent: Dec. 23, 2003

(54) TRENCHED GATE METAL OXIDE SEMICONDUCTOR DEVICE AND METHOD

(75) Inventors: Yowjuang W. Liu, San Jose, CA (US); Donald L. Wollesen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/574,695

(22) Filed: May 17, 2000

Related U.S. Application Data (62) Division of application No. 09/052,051, filed on Mar. 30, 1998, now Pat. No. 6,097,061.

(51) Int. Cl.[7] .......................................... H01L 21/4763
(52) U.S. Cl. ...................... 438/589; 438/197; 438/270; 438/282; 438/585; 438/592
(58) Field of Search ................................ 438/197, 270, 438/282, 585, 589, 592

(56) References Cited

U.S. PATENT DOCUMENTS

| | | | | |
|---|---|---|---|---|
| 4,658,377 A | * | 4/1987 | McElroy ..................... | 365/149 |
| 4,835,585 A | * | 5/1989 | Panousis ..................... | 357/23.4 |
| 4,979,004 A |   | 12/1990 | Esquivel et al. ........... | 357/23.5 |
| 4,990,979 A |   | 2/1991 | Otto ........................... | 357/23.5 |
| 5,270,257 A | * | 12/1993 | Shin ........................... | 437/203 |
| 5,300,447 A | * | 4/1994 | Anderson .................... | 437/41 |
| 5,387,528 A | * | 2/1995 | Hutchings et al. ........... | 437/40 |
| 5,527,720 A | * | 6/1996 | Goodyear et al. ............ | 437/29 |
| 5,624,855 A | * | 4/1997 | Sumida ....................... | 438/135 |
| 5,770,878 A | * | 6/1998 | Beasom ....................... | 257/330 |
| 5,780,340 A | * | 7/1998 | Gardner et al. ............. | 438/259 |
| 5,817,558 A | * | 10/1998 | Wu ............................. | 438/291 |
| 5,953,602 A | * | 9/1999 | Oh et al. ..................... | 438/201 |

OTHER PUBLICATIONS

Wolf (Silicon Processing for the VLSI Era, vol. 1, Lattice Press 1986, p. 397).*

* cited by examiner

*Primary Examiner*—Eddie Lee
*Assistant Examiner*—N. Drew Richards

(57) ABSTRACT

A Metal Oxide Semiconductor (MOS) transistor and method for improving device scaling comprises a trenched polysilicon gate formed within a trench etched in a semiconductor substrate and further includes a source region a drain region and a channel region. The source and drain region are laterally separated by the trench in which the trenched polysilicon gate is formed and partially extend laterally beneath the bottom surface of the trench. The channel region is formed in the silicon substrate beneath the bottom surface of the trench. In one embodiment the top surface of the trenched polysilicon gate is substantially planar to the substrate surface. In another embodiment the top surface and a portion of the trenched polysilicon gate are disposed above the substrate surface.

4 Claims, 10 Drawing Sheets

TRENCHED GATE METAL OXIDE SEMICONDUCTOR DEVICE AND METHOD

RELATED APPLICATIONS

This is a divisional of application Ser. No. 09/052,051 filed on Mar. 30, 1998 U.S. Pat. No. 6,097,061, which is incorporated by reference herein in its entirety.

RELATED APPLICATIONS

The subject matter of this application is related to the subject matter of commonly assigned U.S. patent applications having the following serial numbers and titles: Ser. No. 09/052,057. "A Trenched Gate Non-Volatile Semiconductor Device and Method;", Ser. No. 09/052,058, "Trenched Gate Semiconductor Device and Method for Low Power Applications;", and Ser. No. 09/052,062, "Fully Recessed Semiconductor Device and Method for Low Power Applications," all concurrently filed herewith.

FIELD OF THE INVENTION

The present invention relates generally to semiconductor devices and methods of manufacture, and more particularly, to semiconductor devices and methods of manufacture including a trenched gate.

BACKGROUND OF THE INVENTION

Figure 1:
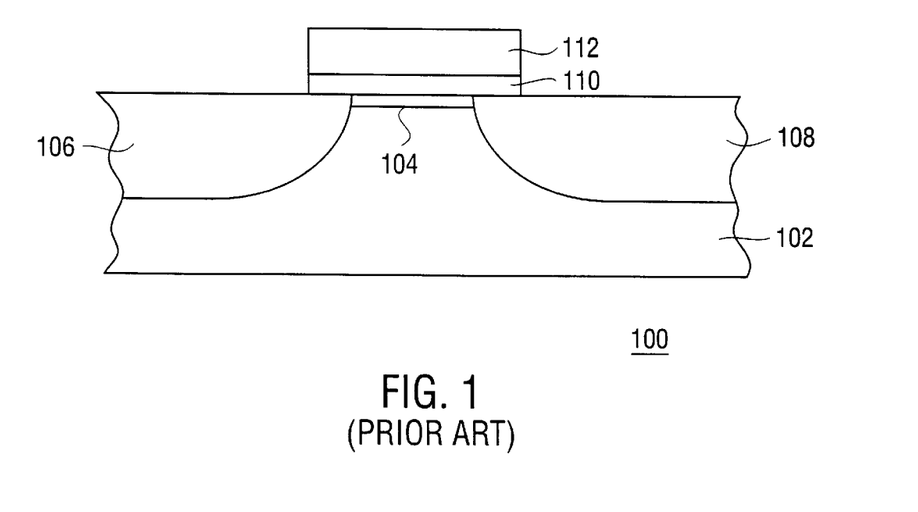
FIG. 1 is cross-sectional view of a conventional single gate transistor.

Conventional Metal Oxide Semiconductor (MOS) transistors for use in semiconductor devices are typically constructed with the gate being formed on a top surface of the semiconductor substrate. FIG. 1 is a cross-sectional view of a cell structure of a conventional MOS transistor 100 including a substrate 102 of a semiconductor crystal such as silicon. The transistor 100 also includes a channel region 104, a source region 106, a drain region 108 a gate dielectric layer 110, and a gate electrode 112. As shown in FIG. 1, the gate dielectric layer 110 and the gate electrode layer 112 are disposed on a top surface of the substrate 102.

As semiconductor devices and integrated circuits are scaled down in size demands for the efficient use of space have increased. Heretofore, conventional MOS circuits have utilized a device structure in which the transistor gate is formed on a top surface of the silicon substrate as shown in FIG. 1. However, this type of device structure is limited in the degree to which active devices can be made smaller in order to improve packing density and performance.

SUMMARY OF THE INVENTION

In accordance with the present invention a semiconductor device is fabricated to include a trenched polysilicon gate which is formed in a trench of a semiconductor substrate. The trenched polysilicon gate structure improves the overall topography of the structure for better process control and improved manufacturability. The trenched polysilicon gate structure of the present invention also advantageously improves the device packing density and scaleability by reducing the lateral diffusion of the source and drain regions under the trenched polysilicon gate. This invention also minimizes the process variations of overlaps between the trenched polysilicon gate and the source and drain regions.

In one embodiment of the present invention a device structure for an MOS circuit includes a trenched polysilicon rate. The trenched polysilicon gate is formed in a trench etched into the semiconductor substrate. The device structure further includes a source region a drain region and a channel region which is implanted in the substrate beneath the bottom surface of the trench. In one embodiment, the top surface of the trenched polysilicon gate is substantially planar to the substrate surface. In another embodiment, the top surface and a portion of the trenched polysilicon gate are above the substrate surface. In yet another embodiment of the present invention, a layer of tungsten silicide or tungsten film is formed over the top surface of the trenched polysilicon gate. In still yet another embodiment, a layer of tungsten silicide or tungsten film is also formed on the side surfaces of the trenched polysilicon gate.

In accordance with one embodiment of the present invention, an MOS device with a trenched polysilicon gate is fabricated by first etching a trench in the silicon substrate and implanting the substrate with dopant impurities to form a channel region beneath the trench. A trench-to-gate insulating layer is formed in the trench followed by a layer of polysilicon to form the trenched polysilicon gate. In one embodiment, the polysilicon gate layer is planarized until the polysilicon is substantially planar with the substrate surface, and a layer of tungsten silicide is formed on the surface of the trenched polysilicon gate. In another embodiment, the polysilicon layer is patterned and etched to form a trenched polysilicon gate having a portion of the polysilicon above the substrate surface. A layer of tungsten silicide is then formed on the trenched polysilicon gate. In yet another embodiment, the polysilicon gate layer is planarized or patterned with tungsten film as transistor gate interconnects.

DESCRIPTION OF THE PREFERRED EMBODIMENT

Figure 2A:
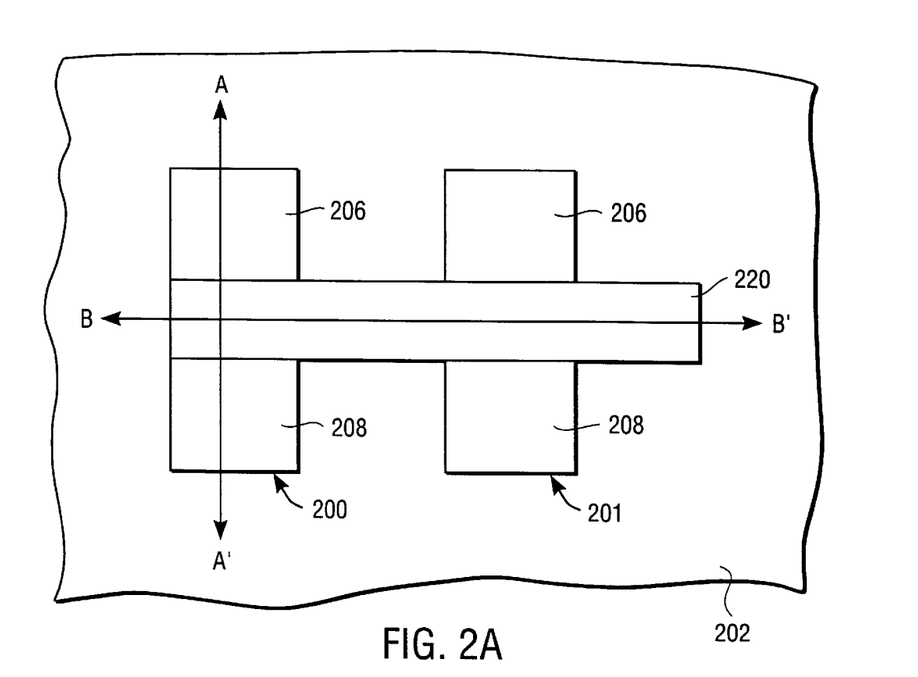
FIGS. 2A–2D are respectively, a top, schematic view and three cross-sectional views of an MOS device embodying the principles of the present invention.

FIG. 2A is a top schematic view of one embodiment of single gate MOS devices fabricated according to the principles of the present invention. FIG. 2A shows semiconductor structures 200 and 201 supported on a semiconductor substrate 202 of a semiconductor crystal such as silicon according to one embodiment of the present invention. The substrate 202 is preferably p-doped or provided with a p-well diffusion region to a suitable threshold voltage level in accordance with conventional silicon semiconductor fabrication techniques. FIG. 2 further shows source regions 206, drain regions 208, and a layer of tungsten silicide 220 patterned to sere as an interconnect for structures of multiple devices. Alternatively, polysilicon may also be used to form the interconnects between multiple device structures. While the different embodiments of the present invention will now be described in terms of a single device structure, it should be recognized that the underlying structures of the present invention may also be coupled to other structures as shown in FIG. 2A to form an array for a semiconductor device such as a memory array. The interconnection between multiple device structures is described below in more detail with reference to FIGS. 3A–3M.

Figure 2B:
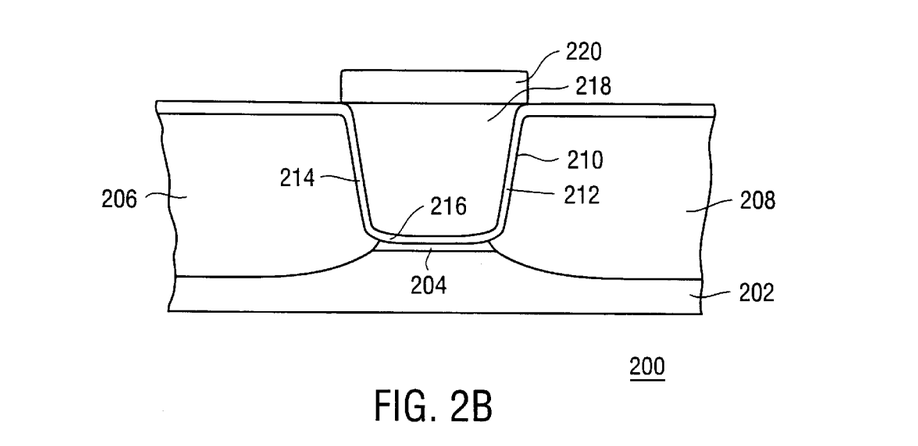

FIG. 2B is a cross-sectional view of one embodiment of a single gate MOS device fabricated according to the principles of the present intention. FIG. 2B shows a cross-sectional view of semiconductor structure 200 of FIG. 2A along line AA'. Structure 200 includes a channel region 204, a source region 206, a drain region 208, a trench 210, a trench-to-gate insulating layer 212 and a trenched gate electrode 218. Source region 206 and drain region 208 are diffusion regions of semiconductor material that are doped with impurities that have a conductivity opposite to the conductivity of substrate 202. For example, when substrate 202 is p-doped, then the opposite conductivity type for source region 206 and drain region 208 is n-type. Preferably source region 206 and drain region 208 are doped with "donor" or n-type impurities of phosphorous, arsenic or the like in conventional manner with a dose range on the order of approximately 1E14 atoms $cm^{-2}$ to approximately 1E16 atoms $cm^{-2}$. Source region 206 and drain region 208 have a depth substantially equal to or greater than the depth of trench 210 and partially extend laterally underneath the bottom of trench 210 to form source and drain junctions disposed along portions of the sidewalls and bottom surface of trench 210. Channel region 204 is an implanted region formed beneath the bottom surface of trench 210 and is immediately contiguous source region 206 and drain region 208. According to one embodiment of the present invention, trench 210 is between approximately 100 Å and 5000 Å wide and from approximately 100 Å to 5000 Å deep. Preferably, trench 210 has rounded corners at the top and bottom of the trench, and the angle of the walls of trench 210 is substantially normal to the top surface. Alternatively, the angle of the trench walls may be slightly sloped to diverge upwardly. Trench-to-gate insulating layer 212 preferably comprises a trench dielectric spacer 214 formed on the vertical surfaces inside trench 210 and a trench gate dielectric 216 formed on the bottom surface inside trench 210. Trench dielectric spacer 214 has preferably a low dielectric constant (K). The thickness of trench dielectric spacer 214 is selected according to the width of trench 210 in order to minimize conduction through the sidewalls of trench 210 and to be optimized for the operational voltage of the device. Trench dielectric spacer 214 also reduces the gate to source and drain capacitance coupling for increased device operation speed. In a preferred embodiment, trench 210 is approximately 3000 Å to 5000 Å wide and trench dielectric spacer 214 is approximately 300 Å thick formed preferably of a fluorine-doped thermal oxide, a deposited high temperature oxide (HTO), or composited dielectric films with a K which is approximately equal to or less than 3.5. Trench gate dielectric 216 is preferably a high K dielectric such as nitrided oxide and is scaled according to the same criteria as those used for trench dielectric spacer 214 but with a thinner thickness than trench dielectric spacer 214. The preferred thickness is approximately 100 Å thick. Trenched gate electrode 218 is formed over trench-to-gate insulating layer 212 and has a top surface which is substantially planar with a surface of substrate 202. Trenched gate electrode 218 is a conductive material such as polysilicon preferably doped with n-type material or a layer of polysilicide and is approximately of the same thickness as the depth of trench 210. Alternatively, trenched gate electrode 218 may comprise several layers, such as polysilicon with a layer of tungsten silicide. In one embodiment, a layer of tungsten silicide 220 is formed on the top surface of trenched gate electrode 218 and tungsten film is patterned on the top surface to electrically interconnect structure 200 to other device structures.

Figure 2C:
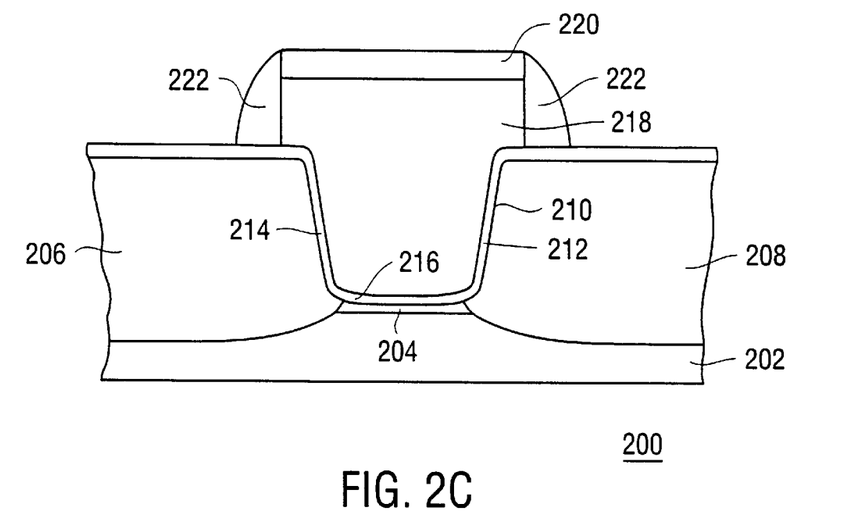

FIG. 2C is a cross-sectional view of another embodiment of the present invention in which the top surface and a portion of the trenched gate electrode are above the surface of substrate. FIG. 2C shows a cross-sectional view of semiconductor structure 200 of FIG. 2A along line AA'. Semiconductor structure 200 includes a channel region 204, a source region 206, a drain region 208, a trench 210, and a trench-to-gate insulating layer 212 as described previously with respect to FIG. 2B. In the present embodiment, structure 200 also includes a trenched gate electrode 218 which is formed over trench-to-gate insulating layer 212 with a top surface and a portion of trenched gate electrode 218 formed above the surface of substrate 202. Trenched gate electrode 218 is a conductive material such as polysilicon preferably doped with n-type material or a layer of polysilicide and has a total thickness greater than the depth of trench 210. Alternatively, trenched gate electrode 218 may comprise several layers such as polysilicon with a layer of tungsten silicide. In one embodiment, a layer of tungsten silicide 220 is formed on the top surface of trenched gate electrode 218. Trenched gate spacers 222 may also be formed at the vertical sides of trenched gate electrode 218 and at the vertical sides of tungsten silicide layer 220.

Figure 2D:
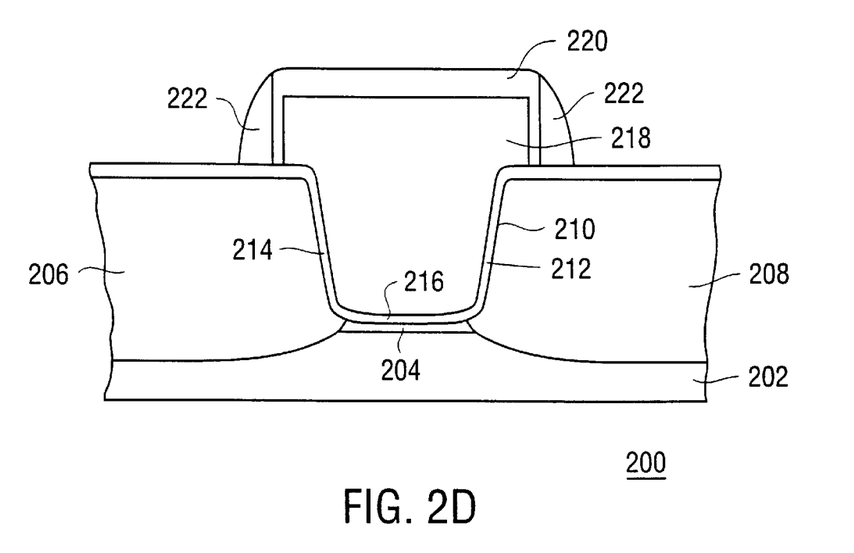

FIG. 2D is a cross-sectional view of yet another embodiment of the present invention in which the top surface and a portion of the trenched gate electrode are above the surface of substrate 202. FIG. 2D shows a cross-sectional view of semiconductor structure 200 of FIG. 2A along line AA'. In such embodiment, tungsten silicide layer 220 is formed on the top surface and the vertical side surfaces of trenched gate electrode 218. Trenched gate spacers 222 are formed at the vertical sides of tungsten silicide layer 220 and tungsten lines are patterned to connect the trenched gate electrodes.

One advantage of the present invention is that the trenched gate electrode provides a device structure with a topology which is more planar than conventional MOS devices, thereby improving the process control and manufacturability of the device. Additionally, the trenched gate device structure improves the scaleability of the device and packing density by reducing the lateral diffusion of the source and drain regions under the trenched gate. The diffusion of the source and drain regions that wraps around the corners of the bottom of the trench is a corner-limiting diffusion process and this reduces the lateral diffusion of the source and drain regions under the trenched gate. The corner-limiting diffusion process is primarily due to the corner effects of the gate trench. In this case, source and drain implants are positioned in regions next to the sidewalls of the trench with the deepest as-implanted dopant peak substantially the same as the trench depth before thermal anneal. During anneal, the lateral diffusion of the source and drain junctions beneath the bottom surface of the trench is constrained by the amount of dopants available at the corner and by the radial nature of the diffusion process. As a result, only a low percentage of dopant can go around the bottom corner and it's a fairly self-limiting process.

FIGS. 3A–3M are cross-sectional views of a semiconductor substrate in various stages of processing in accordance with one embodiment of the present invention. Except where indicated, the cross-sectional views shown in FIGS. 3A–3M are cross-sectional views taken along line AA' in FIG. 2A. While the present invention will now be described in terms of fabricating a single device structure, it should be recognized that the underlying process of the present invention may be employed to fabricate multiple devices on a single substrate. FIG. 3, is a cross-sectional view of a semiconductor water 300 comprising a substrate 302, a pad oxide layer 304 and a nitride layer 306. A photoresist layer 308 is formed on nitride layer 306. According to one embodiment of the present invention, semiconductor substrate 302 is of a desired semiconductor material such as pre-doped silicon. Typically, the selected semiconductor material will be a silicon wafer cut from a single silicon crystal. Pad oxide layer 304 is grown in conventional manner on top of substrate 302 to a thickness of approximately 100 Å. Nitride layer 306 is deposited in conventional manner as a 1500 Å thick layer by chemical vapor deposition (CVD) on top of pad oxide layer 304. Alternatively, pad oxide layer 304 and nitride layer 306 may be formed by other techniques and used to form isolation trenches. Nitride layer 306 comprises silicon nitride ($Si_3N_4$) and serves as a masking layer or etch stop for subsequent oxidation, chemical mechanical planarization, and etch. Pad oxide layer 304 provides stress relief between substrate 302 and nitride layer 306. Conventional photolithographic processing steps are used to mask substrate 302 with photo-resist layer 308 to define the location of a trench in substrate 302 for the trenched gate.

Figure 3A:
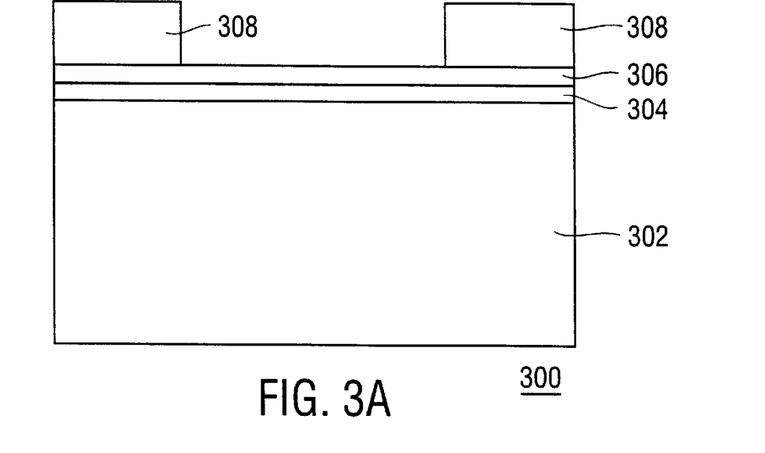
FIGS. 3A–3M are cross-sectional views of a semiconductor substrate in various stages of processing in accordance with one embodiment of the present invention.
Figure 3B:
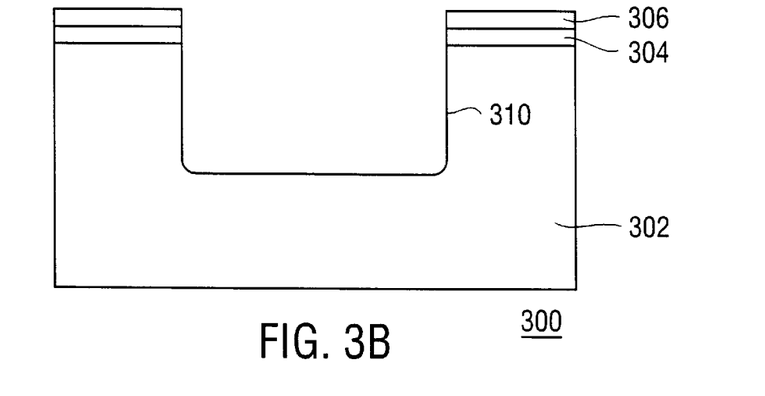
Figure 3C:
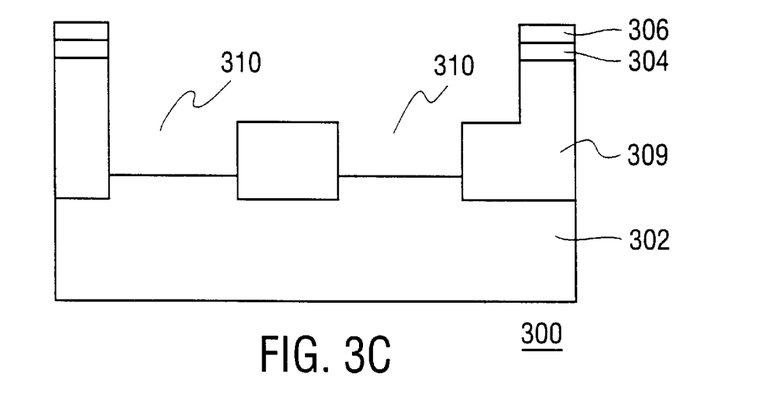

After masking substrate 302 with photo-resist 308, semiconductor wafer 300 is etched to form a trench 310 for the trenched gate electrode. FIG. 3B is a cross-sectional view of semiconductor wafer 300 following an etch step to remove exposed portions of nitride 306 and pad oxide 304 and the underlying silicon substrate in order to form trench 310. Preferably, a Reactive Ion Etch (RIE) is used in conventional manner to form trench 310. The trench etch may include multiple steps such as a nitride etch, an oxide etch, and a high selectivity silicon to oxide etch. Thereafter, photo resist layer 308 is removed in conventional manner. FIG. 3C is a cross-sectional view along line BB' of FIG. 2A of two semiconductor structures formed on substrate 302. FIG. 3C shows trenches 310 of the two structures separated by a field oxide region 309 used for isolation.

Figure 3D:
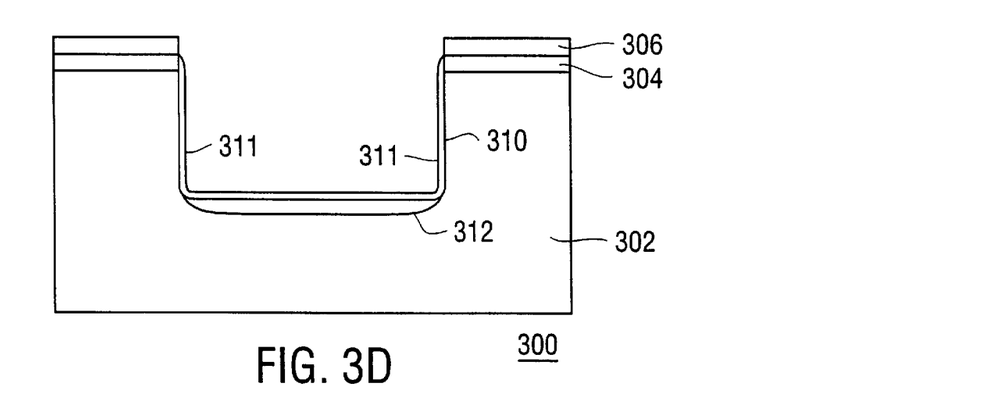

A second pad oxide layer 311 is then grown inside trench 310 to a thickness of approximately 100 Å in conventional manner by thermal oxidation in a dry oxygen ambient either with or without chlorine. After growing second pad oxide layer 311, semiconductor wafer 300 is ion implanted in conventional manner to form a channel region 312. FIG. 3D is a cross-sectional view of semiconductor wafer 300 following ion implantation of channel region 312. In a preferred embodiment of the present invention, channel region 312 is formed using an implant of boron with a dose range on the order of 1E12 atoms $cm^{-2}$ to 1E15 atoms $cm^{-2}$ and an energy of approximately 1 keV to 60 keV at an angle of approximately 0 degrees. In one embodiment, second pad oxide layer 311 is then removed in conventional manner before forming trench-to-gate dielectric layer 314.

Figure 3E:
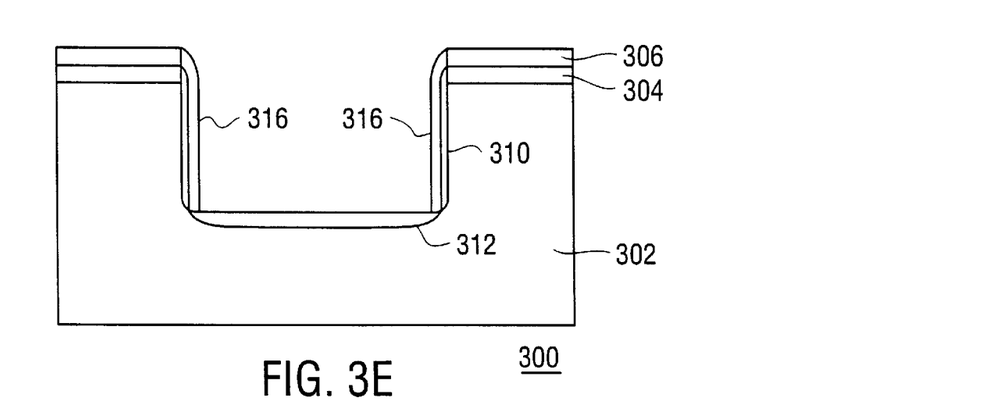
Figure 3F:
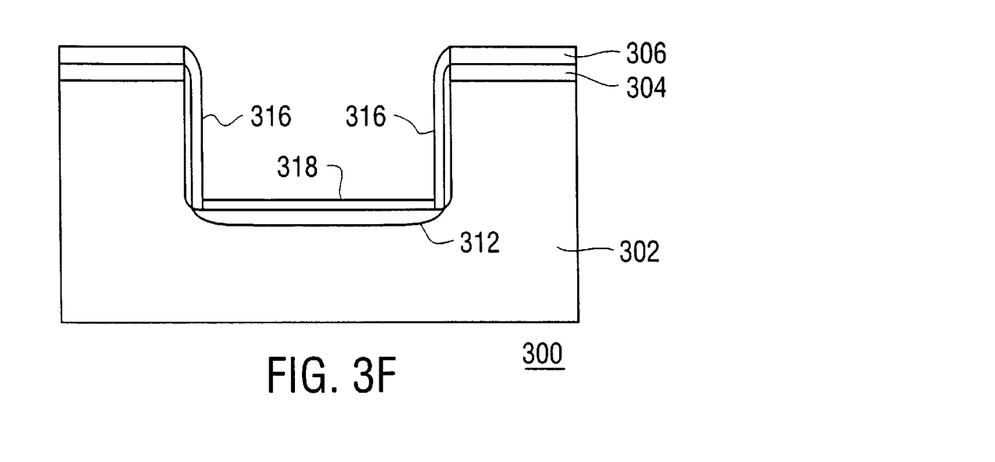

Next, a trench-to-gate dielectric layer is formed in trench 310 to isolate the trenched gate from trench 310. The trench-to-gate dielectric layer preferably comprises a trench spacer dielectric layer 316 formed in conventional manner on upright vertical side walls or side surfaces inside trench 310, and a trench dielectric 318 formed on a bottom surface inside trench 310. FIG. 3E shows a cross-sectional view of semiconductor wafer 300 following formation of the trench spacer dielectric layer 316. First, trench spacer dielectric layer 316 such as a layer of thermally grown and/or deposited oxide and preferably doped with fluorine is formed in conventional manner in trench 310. Preferably, the fluorine doped oxide has a K lower than about 3.5 and a thickness of approximately 300 Å. Trench spacer dielectric layer 316 is then etched in conventional manner preferably using reactive ion etch (RIE) to remove the trench spacer dielectric layer 316 from the bottom surface of trench 310 thereby leaving trench spacer dielectric layer 316 on the vertical sides inside trench 310. In a preferred embodiment of the present invention, a soft silicon etch can be included as a last step of the trench spacer dielectric etch to remove the damaged silicon at the bottom surface of trench 310. After formation of trench spacer dielectric layer 316, trench dielectric 318 is fabricated inside trench 310. FIG. 3F is a cross-sectional view of semiconductor wafer 300 following formation of trench dielectric 318. Trench dielectric 318 is thermally grown or deposited in conventional manner on the bottom surface of trench 310.

Figure 3G:
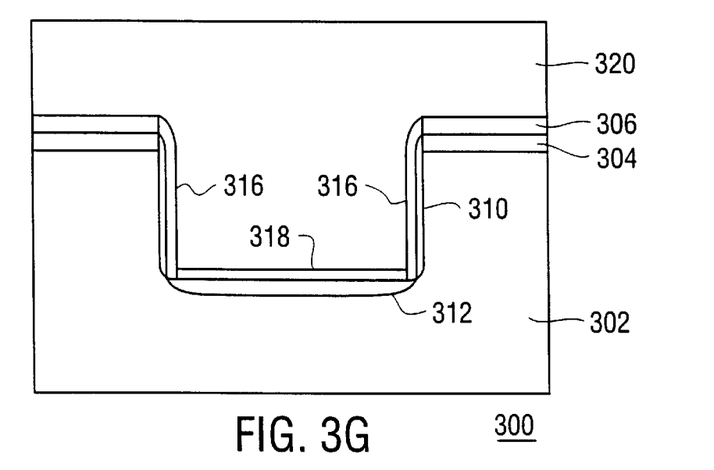

Next, substrate 302 is deposited with a layer of polysilicon 320 to form a trenched gate. FIG. 3G is a cross-sectional view of semiconductor wafer 300 following deposition of polysilicon layer 320. The thickness of polysilicon layer 320 is selected according to the depth of the trench 310. In a preferred embodiment of the invention, the thickness of polysilicon layer 320 is between about 1000 Å and 10,000 Å. Typically, polysilicon layer 320 is formed in conventional manner by low pressure chemical vapor deposition (LPCVD) and is doped in situ in conventional manner.

Figure 3H:
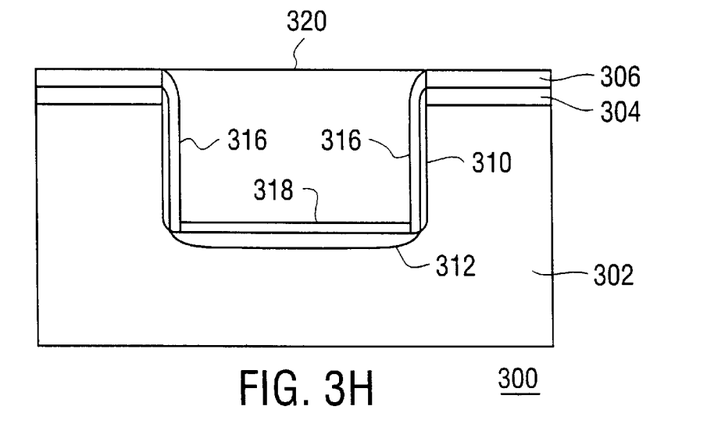
Figure 3I:
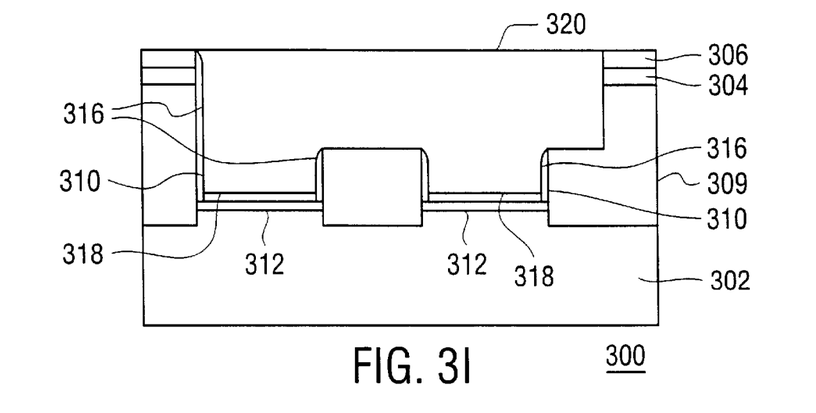
Figure 3J:
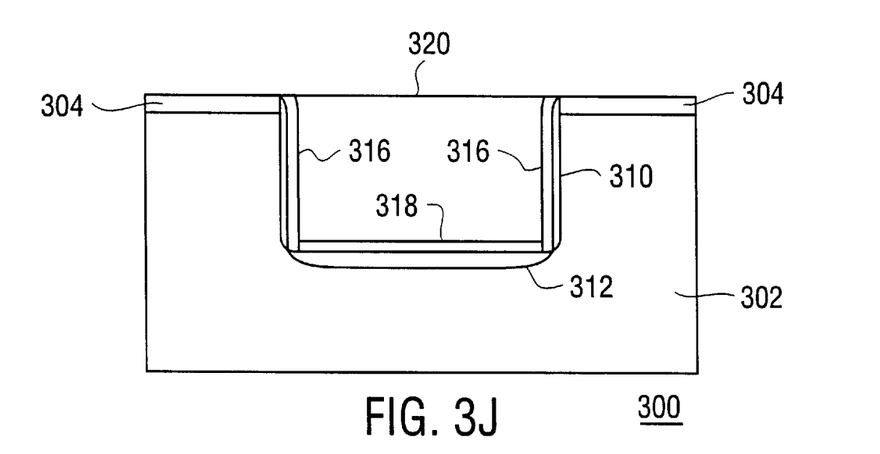

In one embodiment of the present invention, polysilicon layer 320 is subsequently planarized to remove portions of the polysilicon and to provide a trenched gate which is substantially planar with a top surface of substrate 302. FIG. 3H is a cross-sectional view of semiconductor wafer 300 following planarization of polysilicon layer 320. Polysilicon layer 320 can be planarized by using conventional techniques such as chemical-mechanical planarization (CMP). Nitride layer 306 is used as an etch stop for the planarization process. FIG. 3I is a cross-sectional view along line BB' of FIG. 2A of two semiconductor structures formed on substrate 302 following planarization of polysilicon layer 320. In one embodiment, conventional photolithographic steps are used to mask areas of polysilicon layer 320 so that the residual polysilicon layer can be removed selectively. The remaining areas of residual polysilicon are used to interconnect multiple trenched gates. FIG. 3I shows one embodiment of how multiple device structures embodying the principles of the present invention may be interconnected to form an array for a semiconductor device such as a memory array. Nitride laser 306 and a portion of polysilicon layer 320 above the silicon dioxide interface are then removed by a plasma etch as shown in FIG. 3J.

Figure 3K:
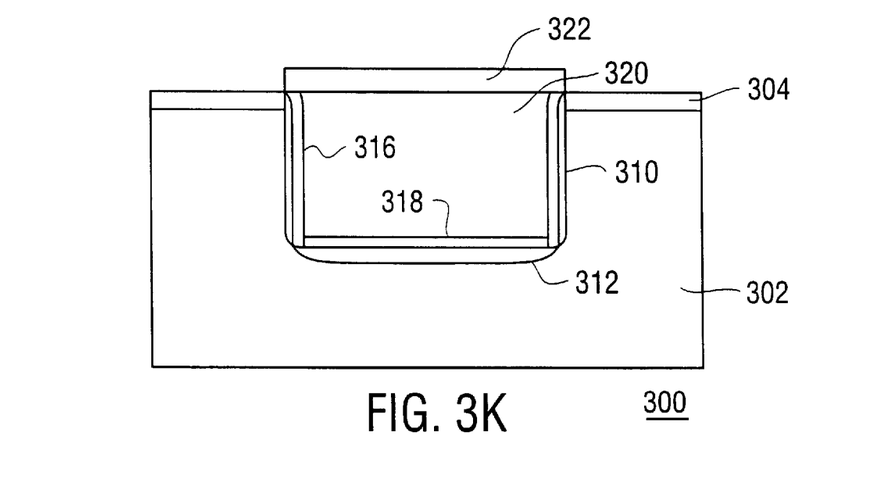

In a preferred embodiment, a layer of tungsten silicide is formed on the top surface of polysilicon layer 320. After plasma etching nitride layer 306 and a portion of polysilicon layer 320, a layer of tungsten is deposited in conventional manner on substrate 302. Semiconductor water 300 is then annealed in conventional manner. A layer of silicide is then formed in conventional manner on substrate 302 to form a layer of tungsten silicide 322 on the surface of polysilicon layer 320. The tungsten film is then selectively removed in conventional manner. FIG. 3K is a cross-sectional view of semiconductor wafer 300 following formation of tungsten silicide layer 322. Standard MOS processing steps are then used to form source and drain regions and to complete processing of the trenched gate MOS device.

Figure 3L:
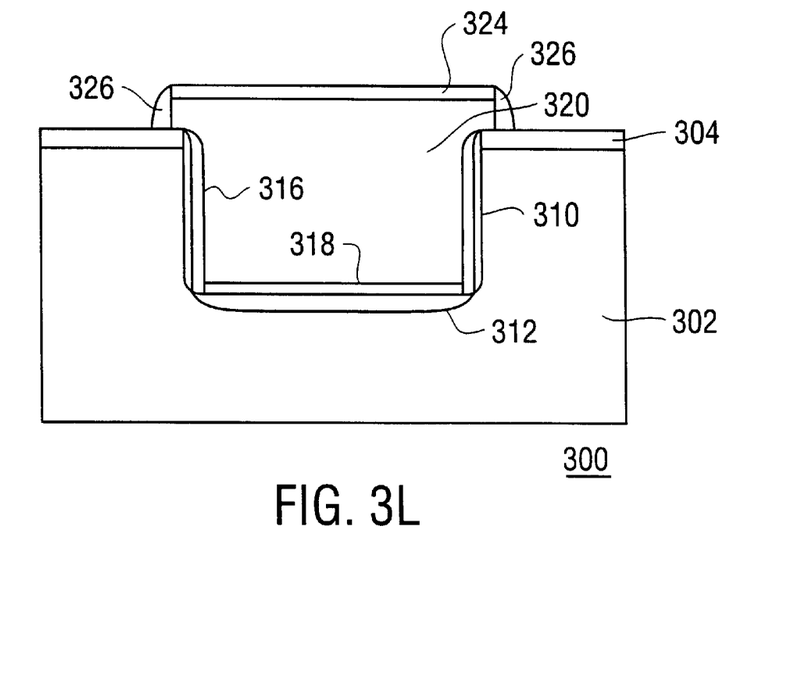

In another embodiment of the present invention, the top surface and a portion of the trenched gate are formed above the substrate surface as shown in FIGS. 2C and 2D. In one embodiment, after depositing substrate 302 with polysilicon 320, a layer of tungsten silicide 324 is formed on polysilicon layer 320 in conventional manner. Thereafter, conventional photolithographic steps are used to mask areas of polysilicon layer 320 and tungsten silicide layer 324 in order to selectively pattern polysilicon layer 320. Trenched gate spacers 326 are then formed in conventional manner at the vertical sides of polysilicon layer 320 and at the vertical sides of tungsten silicide layer 324. Trenched gate spacers 326 are preferably formed by depositing a spacer oxide in conventional manner over wafer 300 followed by a conventional RIE etch to remove the spacer oxide from the horizontal surfaces of wafer 300. FIG. 3L is a cross-sectional view of semiconductor wafer 300 following formation of trenched gate spacers 326. Finally, standard MOS processing steps are used to form source and drain regions and to complete processing of the trenched gate MOS device.

Figure 3M:
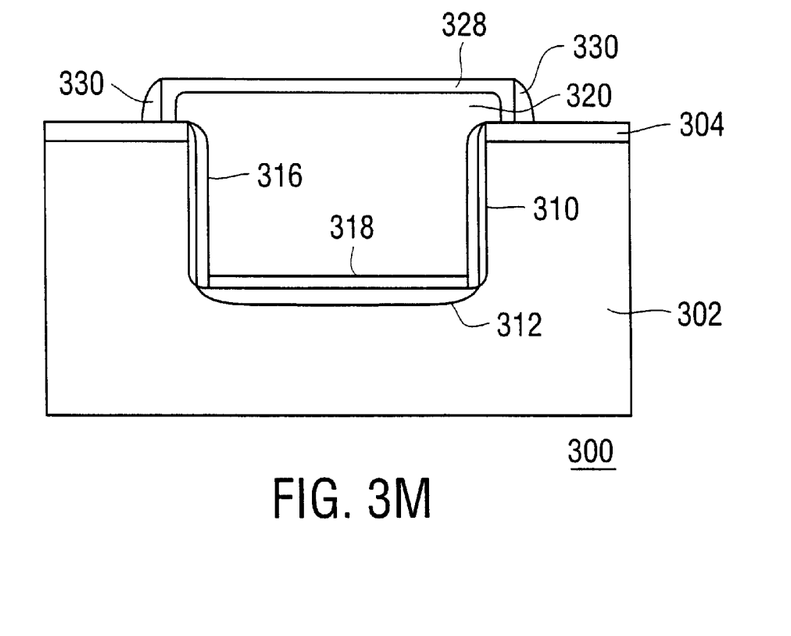

In yet another embodiment of the present invention in which the trenched gate is formed having a top surface and a portion of the trenched gate above the substrate surface, a layer of tungsten silicide is formed on the top surface and at the vertical side surfaces of polysilicon layer 320. After depositing substrate 302 with polysilicon 320, conventional photolithographic steps are used to pattern polysilicon layer 320. A layer of tungsten is then deposited in conventional manner on substrate 302 and annealed in conventional manner. A layer of silicide is then formed in conventional manner on substrate 302 to form tungsten silicide 328 on both the top surface and vertical side surfaces of polysilicon 320 which lie above the surface of substrate 302. Trenched gate spacers 330 are then formed in conventional manner at the vertical sides of tungsten silicide 328. FIG. 3M is a cross-sectional view of semiconductor wafer 300 following formation of trenched gate spacers 330. Finally, standard MOS processing steps are used to form source and drain regions and to complete processing of the trenched gate MOS device.

Figure 4A:
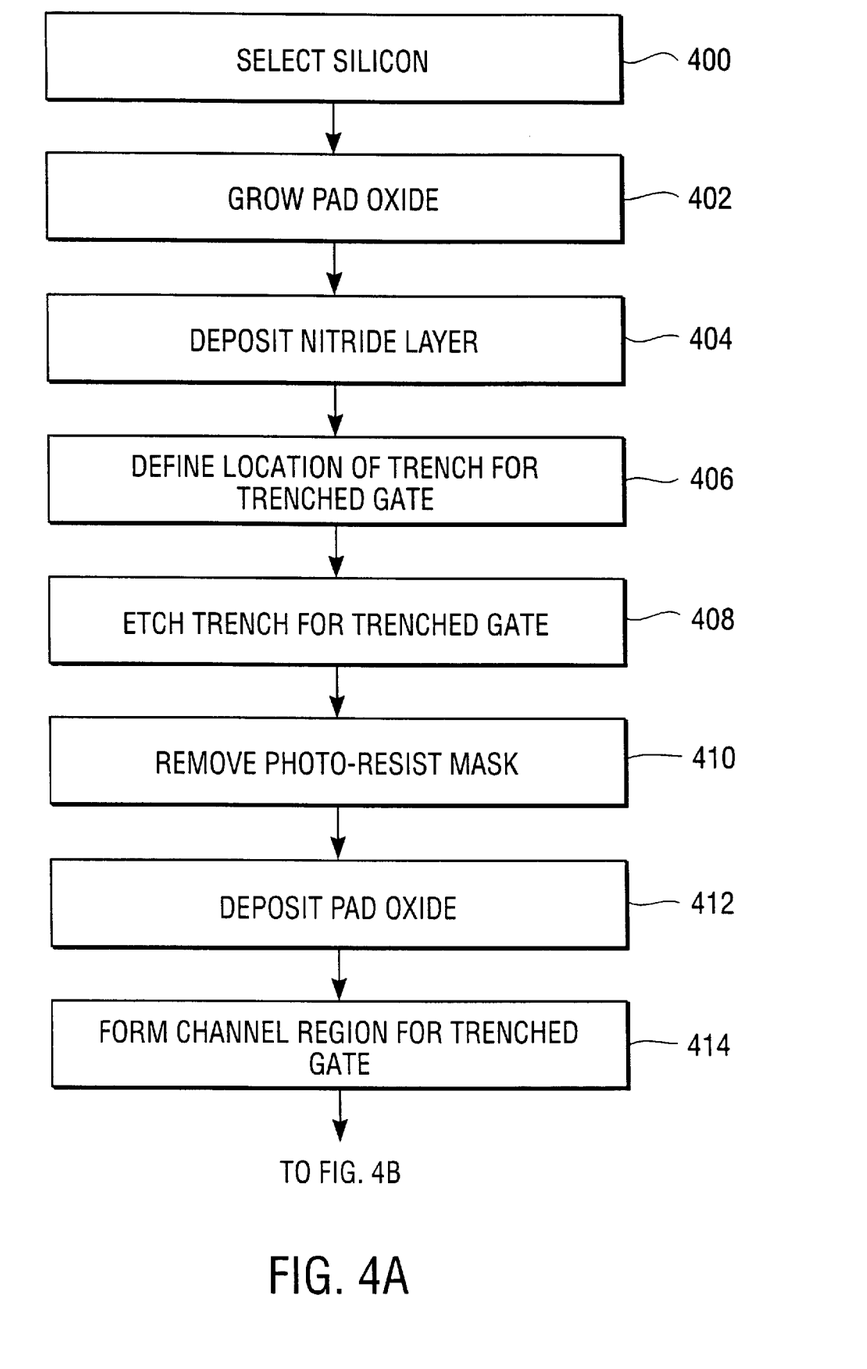
FIGS. 4A and 4B comprise a flow chart representing the stages of manufacture according to the illustrated embodiment of FIGS. 3A–3M.
Figure 4B:
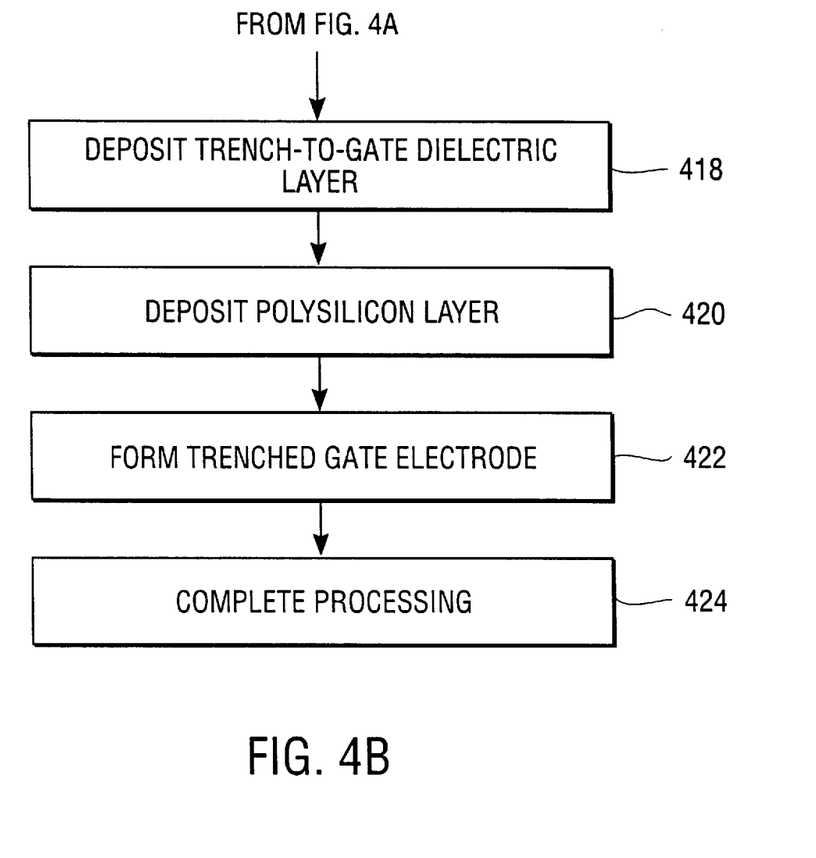

FIGS. 4A and 4B comprise a flow chart detailing one embodiment of the method of the present invention for producing a trenched gate MOS device in accordance with the present intention. After a semiconductor substrate of a desired semiconductor material is selected 400 for processing, a pad oxide layer and a nitride layer are formed 402, 404 on the substrate. The oxide/nitride layer is then masked with a photo-resist layer to define the location of the trench for the trenched gate 406. The exposed oxide/nitride layer and the underlying silicon substrate are etched 408 to form the trench for the trenched gate and the photo-resist mask is removed 410. A second pad oxide layer is then grown 412 on the substrate. Thereafter, the substrate is ion implanted to form 414 the channel region for the device. A trench-to-gate dielectric layer for insulating the trenched gate from the trench is formed 418 at the vertical sides and on the bottom surface inside the trench. A polysilicon layer is then deposited 420 on the substrate and in the trench, and the trenched gate electrode is formed 422. Finally, standard MOS processes are used to complete 424 processing of the structure.

What is claimed is:

1. A method for fabricating a semiconductor device with a trenched gate electrode comprising:

etching a semiconductor substrate to form a trench having substantially upright vertical surfaces and a bottom surface in the semiconductor substrate;

forming a trench-to-gate dielectric layer on the substantially vertical surfaces and the bottom surface inside the trench;

forming a trenched gate electrode inside the trench by depositing a polysilicon layer;

selectively removing the polysilicon layer to form the trenched gate electrode and a residual polysilicon interconnect to another trenched gate electrode;

forming a source region and a drain region in the semiconductor substrate, the source and drain regions being spaced apart by the trench immediately contiguous to the substantially upright vertical sides of the trench; and implanting a channel region formed beneath the bottom of the trench and immediately contiguous to the source region and the drain region.

2. The method of claim 1 wherein forming the trenched gate electrode further comprises planarizing the layer of polysilicon to substantially planar orientation with a top surface of the semiconductor substrate.

3. The method of claim 1 wherein forming the trenched gate electrode further comprises depositing and patterning a layer of photoresist on the layer of polysilicon to define the trenched gate electrode and the interconnect.

4. The method of claim 1 wherein forming the trenched gate electrode further comprises:

forming a layer of tungsten silicide on the layer of polysilicon;

depositing and patterning a layer of photoresist on the layer of tungsten silicide; and etching the layer of tungsten silicide to form the trenched gate electrode.

* * * * *